(12) United States Patent
Verweij et al.

(10) Patent No.: US 8,059,261 B2
(45) Date of Patent: Nov. 15, 2011

(54) MASKING DEVICE, LITHOGRAPHIC APPARATUS, AND DEVICE MANUFACTURING METHOD

(75) Inventors: Antoine Hendrik Verweij, Dussen (NL); Jacobus Frederik Molenaar, Utrecht (NL); Gerbrand Petrus Johannes Van Den Hoven, Gernert (NL); Michael Johannes Vervoordeldonk, Rosmalen (NL); Michel Gerardus Pardoel, Mierlo (NL); Gerardus Johannes Verdoes, Eindhoven (NL); Jan Van Eijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1312 days.

(21) Appl. No.: 10/855,976

(22) Filed: May 28, 2004

(65) Prior Publication Data
US 2005/0012913 A1 Jan. 20, 2005

(30) Foreign Application Priority Data

May 30, 2003 (EP) .................................... 03076673

(51) Int. Cl.
G03B 27/72 (2006.01)
(52) U.S. Cl. .......................................... 355/71
(58) Field of Classification Search .................... 355/71, 355/30, 67, 74; 248/638
See application file for complete search history.

(56) References Cited

U.S. PATENT DOCUMENTS

| 4,589,769 | A | | 5/1986 | Matsuki | |
|---|---|---|---|---|---|
| 5,390,227 | A | * | 2/1995 | Mizusawa et al. | 378/34 |
| 5,473,410 | A | * | 12/1995 | Nishi | 355/53 |
| 5,600,698 | A | * | 2/1997 | Terashima et al. | 378/34 |
| 5,632,942 | A | * | 5/1997 | Yeh et al. | 156/89.17 |
| 5,889,758 | A | | 3/1999 | Maehara et al. | |
| 6,040,893 | A | | 3/2000 | Ebinuma | 355/53 |
| 6,259,509 | B1 | | 7/2001 | Miwa et al. | 355/53 |
| 6,307,619 | B1 | * | 10/2001 | Galburt et al. | 355/53 |
| 6,348,303 | B1 | * | 2/2002 | Van Der Lei et al. | 430/397 |
| 6,388,733 | B1 | * | 5/2002 | Hayashi | 355/53 |
| 6,465,797 | B2 | * | 10/2002 | Okunuki | 250/492.3 |
| 6,597,002 | B1 | | 7/2003 | Kondo | 250/492.2 |
| 6,806,943 | B2 | * | 10/2004 | Barringer et al. | 355/75 |
| 7,066,240 | B2 | * | 6/2006 | Dussinger et al. | 165/104.26 |

(Continued)

FOREIGN PATENT DOCUMENTS

EP 0 744 663 A1 11/1996

(Continued)

OTHER PUBLICATIONS

Excerption from "Semiconductor Memories," B. Prince, 2nd Edition, Wiley (1991), pp. 9 and 90-91.

(Continued)

*Primary Examiner* — Peter B Kim
*Assistant Examiner* — Chia-how Michael Liu
(74) *Attorney, Agent, or Firm* — Pillsbury Winthrop Shaw Pittman LLP

(57) ABSTRACT

A lithographic projection apparatus having a masking device for obscuring part of at least one of a patterning device used for patterning a projection beam before imaging the patterned beam onto a substrate. The masking device includes a first masking structure to obscure said part of said patterning device in a first direction and a second masking structure to obscure said part in a second different direction, wherein said first and second masking structure are disposed in the vicinity of said focal plane in a mechanically uncoupled arrangement with respect to each other.

63 Claims, 9 Drawing Sheets

U.S. PATENT DOCUMENTS

| | | | |
|---|---|---|---|
| 2001/0046038 A1* | 11/2001 | Mulkens et al. | 355/67 |
| 2002/0054283 A1* | 5/2002 | Kato et al. | 355/55 |
| 2002/0196820 A1* | 12/2002 | Sato et al. | 372/29.02 |

FOREIGN PATENT DOCUMENTS

| | | | |
|---|---|---|---|
| JP | 60-45252 A | 3/1985 | |
| JP | 63-95399 | 4/1988 | |
| JP | 2-73618 A | 3/1990 | |
| JP | 3-11613 A | 1/1991 | |
| JP | 8-264422 A | 10/1996 | |
| JP | 10-97989 A | 4/1998 | |
| JP | 11-67656 A | 3/1999 | |
| JP | 11-233399 A | 8/1999 | |
| JP | 2000-68199 A | 3/2000 | |
| JP | 2000-216079 | 8/2000 | |
| JP | 2001-218424 | 8/2001 | |
| JP | 2003-017396 | 1/2003 | |
| WO | 99/63585 | 12/1999 | |

OTHER PUBLICATIONS

European Search Report, dated Jul. 26, 2005.
"European Search Report completed Mar. 26, 2004".

* cited by examiner

MASKING DEVICE, LITHOGRAPHIC APPARATUS, AND DEVICE MANUFACTURING METHOD

PRIORITY INFORMATION

This application claims priority from European Patent Application No. 03076673.7, filed May 30, 2003, herein incorporated by reference in its entirety.

BACKGROUND OF THE INVENTION

1. Field of the Invention

The present invention relates to a masking device, a related lithographic projection apparatus, and a device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder, which ensures that the mask can be held at a desired position in the incoming radiation beam, and that it can be moved relative to the beam if so desired;

a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and a programmable LCD array: an example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder; however, the general principles discussed in such instances should be seen in the broader context of the patterning device as set forth here above.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask table/holders). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and U.S. Ser. No. 09/180,011, filed 27 February, 1998 (WO 98/40791), incorporated herein by reference.

In general, a single wafer will contain a whole network of adjacent target portions that are successively irradiated via the projection system, one at a time. In current apparatus, employing patterning by a mask on a mask table/holder, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table/holder is scanned. More information with regard to lithographic devices as here described can be gleaned, for example, from U.S. Pat. No. 6,046,792, incorporated herein by reference.

It is often desirable or necessary to ensure that only a certain part of the mask is imaged by the projection beam to the substrate. For example, the mask may contain more than one pattern of which only one is used for a given exposure. It is also often desirable or necessary to stop stray light from impinging on the substrate. In lithographic projection systems using this function, it is typically achieved by providing a mask masking device at an intermediate plane in the illuminator.

In a stepper system, where the mask is fixed with respect to the illuminator, the mask masking device is provided adjacent the mask and is also fixed with respect to the illuminator and the mask.

Conventional masking devices comprise at least one moveable blade. In certain conventional devices two sets of moveable blades are provided. Typically, the two sets of blades are mechanically coupled to a support and each support is mounted on a common frame. Thus, conventionally the sets of blades are mechanically coupled to each other.

Generally, the two sets of blades may be disposed in a plane in the illumination unit. Each set of moveable blades comprise a pair of blades arranged to move together and apart in one direction, the Y-direction, hereinafter referred to as the Y-blades, and the other pair of blades is arranged to move together and apart in a direction perpendicular to the Y-blades, in the X-direction, hereinafter referred to as the X-blades. There are currently two types of mask masking schemes: (a) masking for static exposure and (b) masking for scanning exposure. In static exposure, part of the mask is blocked for the duration of an exposure. In scanning exposure, a part of the mask is blocked for a predetermined length of time.

The blades may be set so that there is a predetermined distance between the X-blades and the Y-blades, respectively. Conventionally, the Y-blades are arranged to be moveable during scanning, and the X-blades, although moveable, are generally arranged to be stationary during scanning. If the X-blades are to be moved, this generally takes place in between scans. For static exposures the X-blades may be moved between exposures. For scanning exposure, Y-blades in particular are arranged to perform additional movements to allow scanning of the patterning device by the radiation source to take place. Before a scanning cycle begins, the blades are arranged to prevent any radiation impinging on the patterning device. At the beginning of the scanning cycle the Y-blades open to a scanning distance. At the end of the scanning cycle, the Y-blades, in particular, move into a position in which light is prevented from impinging on the patterning device, so that at the end of the scanning cycle no light impinges on the patterning device.

SUMMARY OF THE INVENTION

The inventors of the present invention have identified that problems exist with conventional masking devices. For example, problems arise when the masking devices are arranged to scan the mask. As higher scanning speeds are demanded, conventional masking devices fail. In particular, with some conventional masking devices the mass of the coupled X-Y blades creates inertia, preventing the Y-blades from being able to be accelerated and decelerated fast enough to open to their scanning position, and close at the end of the scan position, respectively. Further, the high moving mass cannot be satisfactorily moved at high enough scanning speeds by conventional motors without causing disturbances to be transferred to other parts of the apparatus.

For at least one of these reasons, the principles of the present invention, as embodied and broadly described herein, provide for an apparatus and method which can effectively mask portions of the mask of a lithographic projection apparatus during scanning as well as static exposure. In one embodiment, the lithographic apparatus comprises an illumination system configured to provide a beam of radiation, said illumination system defining a focal plane through which the beam of radiation passes; a support structure configured to support a patterning device at a location, said patterning device serving to pattern the beam of radiation according to a desired pattern; a masking device configured to obscure at least a part of the patterning device from the beam, the masking device comprising a first masking structure arranged to obscure said part in a first direction relative to said location and a second masking structure arranged to obscure part of said location in a second, different direction relative to said location, wherein said first and second masking structures are disposed in the vicinity of the focal plane in a mechanically uncoupled arrangement relative to each other; a substrate holder configured to hold a substrate; and a projection system configured to image the patterned beam onto a target portion of the substrate.

Such an arrangement provides an advantage in that the first and second masking structures are isolated from one another while providing an effective masking function. A further advantage being that vibrations and disturbances from the first masking structure and the apparatus frame do not disturb the second masking structure, and vice versa. The uncoupled masking structure have a lower mass than the coupled masking structure. Thus, lower driving forces are required to move the masking structure enabling higher accelerations and scanning speeds to be achieved.

According to another embodiment of the present invention, there is provided a lithographic projection apparatus in which said first masking structure is provided with a cooling device.

This arrangement provides the advantage in that the cooling of the first masking structure enables the dimension of a first set of blades of the masking structure in the direction of the projection beam (the thickness) to be reduced in comparison with conventional blades. The thinner first set of blades takes up less room in the region of the focal plane than conventional blades enabling a second set of blades to also be disposed within proximity of the focal plane, yet still provide good masking with sharp edges.

According to a further aspect of the invention there is provided a device manufacturing method comprising providing a substrate that is at least partially covered by a layer of radiation-sensitive material; conditioning a beam of radiation using an illumination system; providing a support configured to support a patterning device; configuring the beam of radiation with a desired pattern in its cross-section based on the patterning device; projecting the patterned beam of radiation onto a target area of the layer of radiation-sensitive material; and selectively obscuring part of said patterning device from said projection beam or said patterned beam by using a first masking structure to selectively obscure said part in a first direction with respect to said location, and using a second masking structure to selectively obscure said part in a second different direction with respect to said location, wherein said first masking structure and second masking structure are disposed in the vicinity of a focal plane of said projection beam in a mechanically uncoupled arrangement with respect to one another; and projecting the patterned beam of radiation onto a target area of the layer of radiation-sensitive material.

In a manufacturing process using a lithographic projection apparatus according to the invention a pattern (e.g. in a mask) is imaged onto a substrate that is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms "radiation" and "beam" are used to encompass all types of electromagnetic radiation, including ultra-violet radiation (e.g. with a wavelength of 365, 248, 193, 157 or 126 nm) and extreme ultra-violet (EUV) radiation (for example, having a wavelength in the range of 5-20 nm), as well as particle beams, such as ion beams or electron beams.

BRIEF DESCRIPTION OF DRAWINGS

Embodiments of the invention will now be described, by way of example only, with reference to the accompanying schematic drawings in which.

In the Figures, corresponding reference symbols indicate corresponding parts.

DETAILED DESCRIPTION OF THE INVENTION

Figure 1:
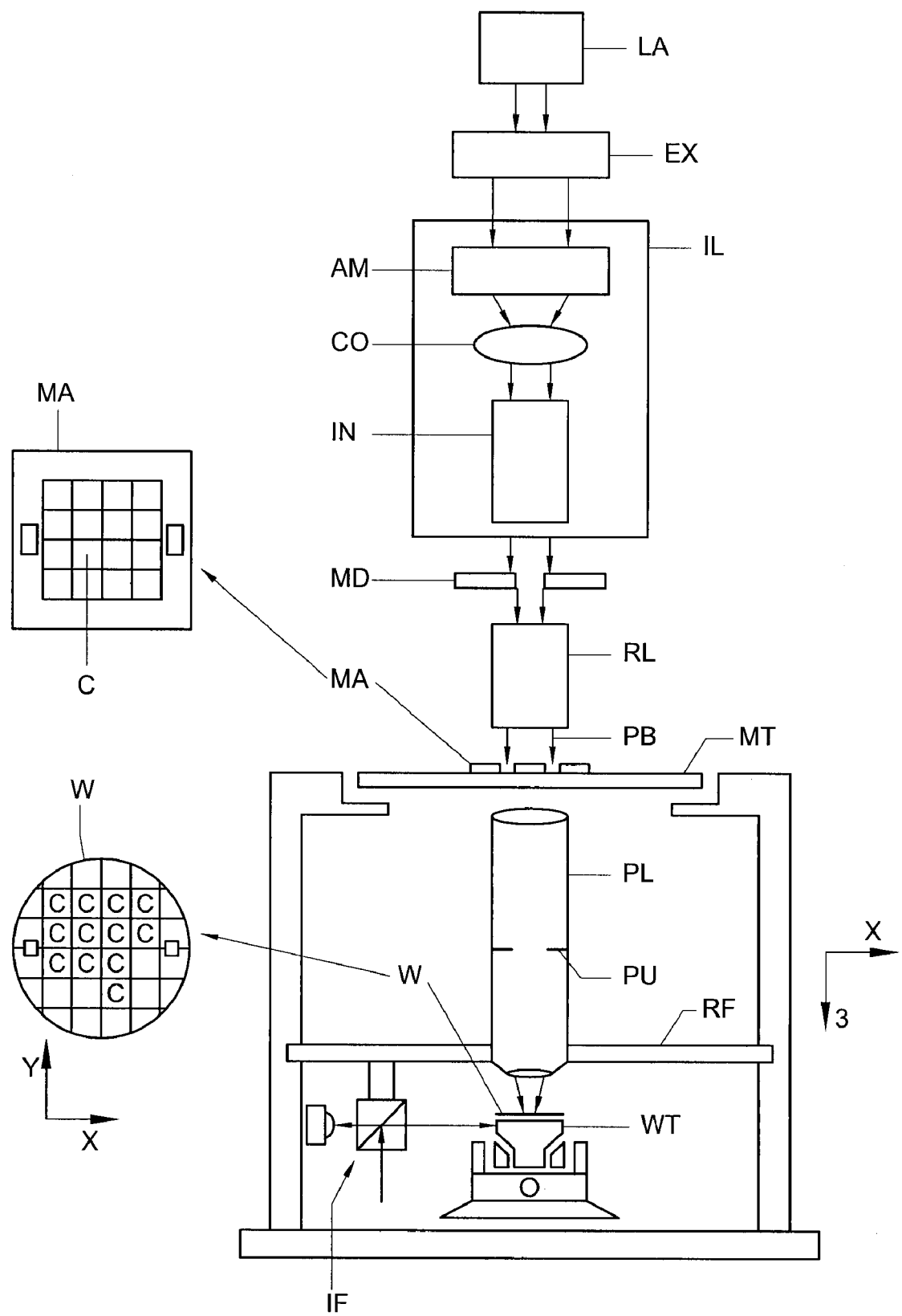
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL: for supplying a projection beam PB of radiation (e.g. UV radiation). In this particular case, the radiation system also comprises a radiation source LA;

a masking device MD: provided for selectively shielding parts of a mask MA (eg. a reticle) from the projection beam, in other embodiments, masking device may be provided to selectively shield parts of the patterned projection beam;

relay optics RL: provided for projecting the radiation that passes through the masking device to the mask MA;

.a first object table (mask table/holder) MT: provided with a mask holder for holding the mask MA, and connected to first positioning mechanism for accurately positioning the mask with respect to item PL;

.a projection system ("lens") PL: (e.g. a projection lens) for imaging an irradiated portion of the mask MA onto a target portion C (comprising one or more dies) of a substrate W: and .a second object table (substrate table/holder) WT: provided with a substrate holder for holding the substrate W (e.g. a resist-coated silicon wafer), and connected to second positioning mechanism for accurately positioning the substrate with respect to item PL.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The radiation system may comprise a source LA (e.g. a mercury lamp, a Krypton-Fluoride excimer laser or a plasma source) that produces a beam of radiation. This beam is fed into an illumination system (illuminator) IL, either directly or after having traversed conditioning mechanism, such as a beam expander Ex, for example. The illuminator IL may comprise adjusting mechanism AM for setting the outer and/or inner radial extent (commonly referred to as σ-outer and σ-inner, respectively) of the intensity distribution in the beam. In addition, it will generally comprise various other components, such as a condenser CO and an integrator IN. The condensor CO projects the incoming light to the integrator IN. The integrator IN may, for example, be formed of a quartz rod, and is used to improve the intensity distribution of the beam to be projected over the cross section of the beam. The integrator IN thus improves the illumination uniformity of the projection beam PB. In this way, the beam PB impinging on the mask MA has a desired uniformity and intensity distribution in its cross-section.

The radiation system may further include a relay optics RL. The relay optics are preferably a sealed assembly mounted in the lithography apparatus and contains expansion optics, a mirror for directing the projection beam toward the mask, a further condensor lens and a projecting lens. The function of the relay optics RL is to image the masking device "image" plane on the reticle mask "focus" plane. The relay optics RL is optional. Its main functions are to image the blades of the masking device with a sufficiently small edge width, match the entrance pupil function of the projection lens, and provide a uniform illumination of the mask.

It should be noted with regard to FIG. 1, that the source LA may be within the housing of the lithographic projection, but that it may also be remote from the lithographic projection apparatus, the radiation beam which it produces being led into the apparatus (e.g. with the aid of suitable directing mirrors). The current invention and claims encompass both of these scenarios.

Figure 4:
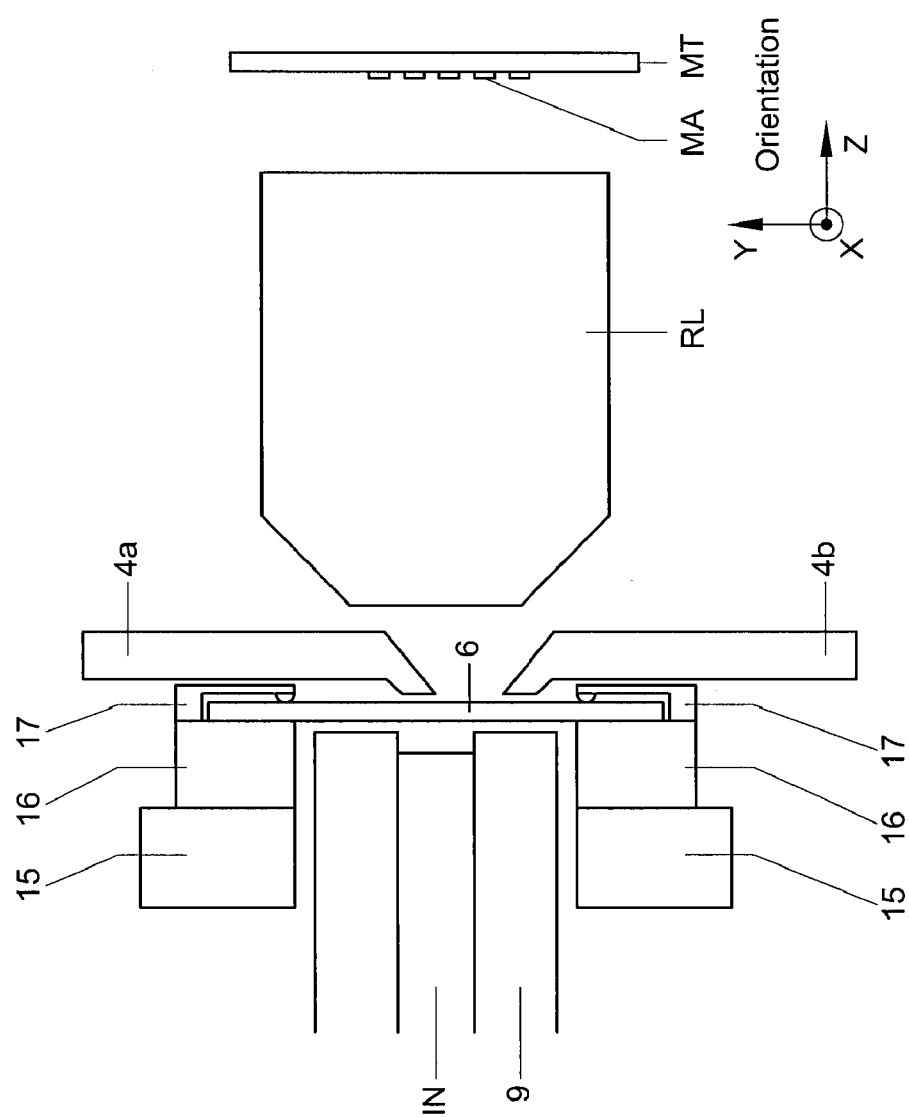
FIG. 4 shows a cross section in the YZ plane of part of the lithographic apparatus shown in FIG. 1 showing stacking of masking blades according to an embodiment of the invention.

In FIG. 1, the masking device MD is disposed between the illuminator IL and the relay optics RL. However, as shown in FIG. 4, the masking device MD may instead be disposed directly above the mask MA. The masking device MD is a spatial filter. Those parts of the projection beam falling on the masking device will be preferably reflected or absorbed. Only those parts of the projection beam not falling on the masking device will be transmitted. The masking device projects a "slit" on to the mask. As discussed below, the masking device is controllable to control the dimensions of the slit through which the projection beam passes.

Either directly after passing through the masking device MD, or subsequent to passing through the relay optics RL, the beam PB intercepts the mask MA which is held in a mask holder on a mask table/holder MT MT. Having been transmitted through (or reflected by in the case of a reflective mask) the mask MA, the beam PB passes through the projection system PL, which focuses the beam PB onto a target portion C of the substrate W. With the aid of the second positioning mechanism (and interferometric measuring mechanism IF), the substrate table/holder WT can be moved accurately, e.g. so as to position different target portions C in the path of the beam PB. Similarly, the first positioning mechanism can be used to accurately position the mask MA with respect to the path of the beam PB, e.g. after mechanical retrieval of the mask MA from a mask library, or during a scan. In general, movement of the object tables MT, WT will be realized with the aid of a long stroke module (coarse positioning) and a short stroke module (fine positioning), which are not explicitly depicted in FIG. 1. However, in the case of a wafer stepper (as opposed to a step-and-scan apparatus) the mask table/holder MT may just be connected to a short stroke actuator, or may be fixed.

The depicted apparatus can be used in different modes:

step mode: the mask table/holder MT is kept essentially stationary, and an entire mask image is projected in one go (i.e. a single "flash") onto a target portion C. The substrate table/holder WT is then shifted in the X and/or Y directions so that a different target portion C can be irradiated by the beam PB;

scan mode; essentially the same scenario applies, except that a given target portion C is not exposed in a single "flash". Instead, the mask table/holder MT is movable in a given direction (the so-called "scan direction", e.g. the Y-direction) with a speed v, so that the projection beam PB is caused to scan over a mask image; concurrently, the substrate table/holder WT is simultaneously moved in the same or opposite direction at a speed V=M v, in which M is the magnification of the lens PL (typically, M=¼ or ⅕). In this manner, a relatively large target portion C can be exposed, without having to compromise on resolution; and other mode: the mask table/holder MT is kept essentially stationary holding a programmable patterning device, and the substrate table/holder WT is moved or scanned while a pattern imparted to the projection beam is projected onto a target portion C. In this mode, generally a pulsed radiation source is employed and the programmable patterning device is updated as required after each movement of the substrate table/holder WT or in between successive radiation pulses during a scan. This mode of operation can be readily applied to maskless lithography that utilizes programmable patterning device, such as a programmable mirror array of a type as referred to above.

Figure 2:
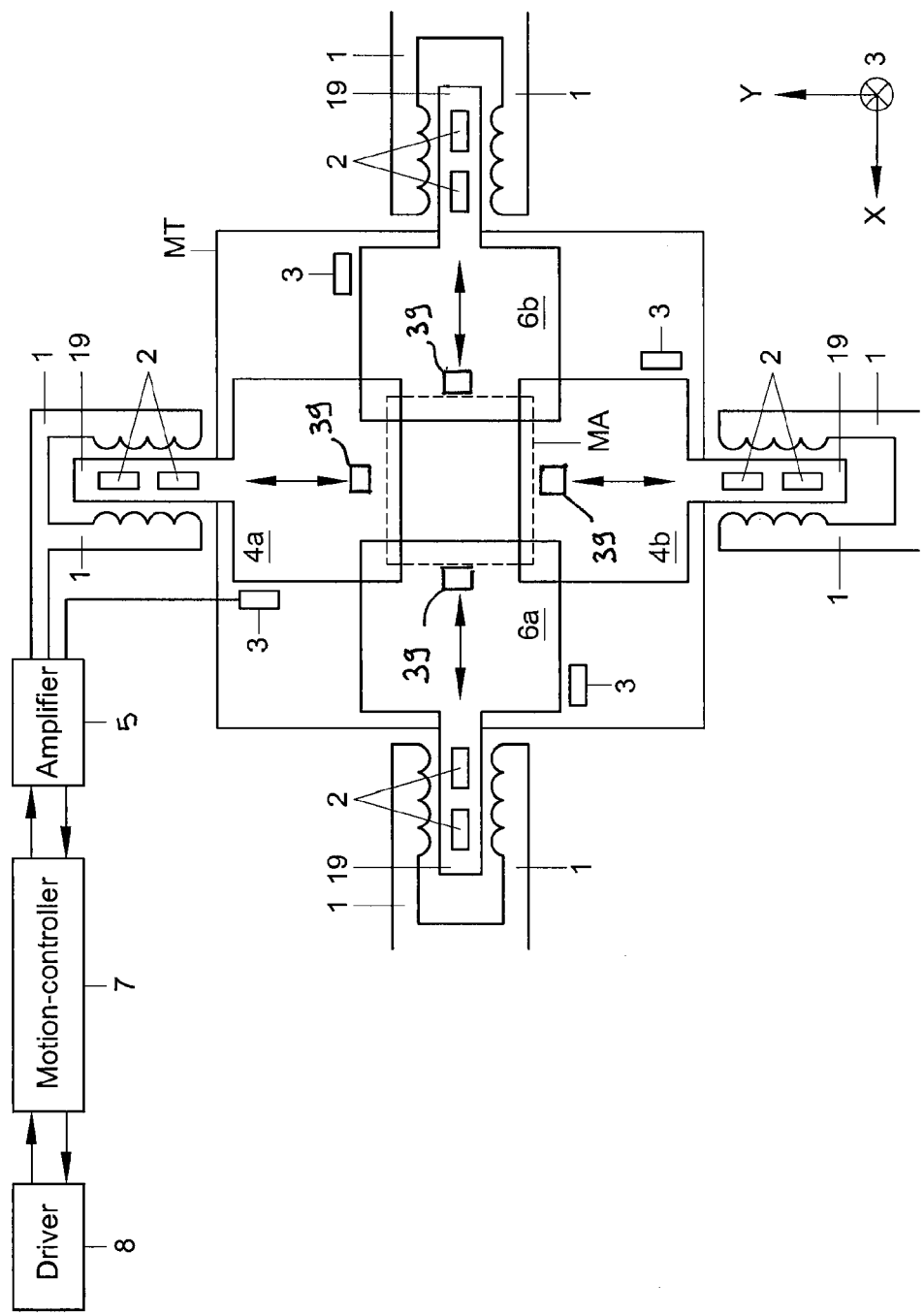
FIG. 2 shows a masking device according to an embodiment of the invention.

FIG. 2 shows a masking device according to an embodiment of the invention. The masking device MD comprises a first masking structure and a second masking structure. The masking structures may be plates or blades or other constructions suitable for selectively obscuring the location at which the patterning device, when in use, is located. The masking device preferably comprises blades 4a, 4b, 6a, 6b, which are arranged to form two sets of blades: the X-blades and the Y-blades. The two sets of blades are mechanically uncoupled with respect to one another. That is to say, that the blades are mounted in such a manner that a vibration generated in either an X or Y blade is not transmitted to a Y or X blade, and vice versa. The mounting of the X and Y blades is described in more detail hereinafter.

The blades may also be considered as being plates or other constructions suitable for obscuring. According to one embodiment of the invention, the Y blades 4a and 4b are driven, while the X-blades 6a and 6b are stationary during exposure. However, the invention is not limited in this respect and the Y-blades may be stationary, or the X-blades may be moveable while the Y-blades are stationary. The blades which move during scanning, hereinafter referred to as the Y blades are controlled by software and electronics. The X-blades are similarly controlled with software and electronics. It is noted that according to the currently observed convention, the Y-blades move together and apart in the Y-direction, the Y-direction also being the scanning direction, i.e. the direction in which the mask table/holder MT and the substrate table/holder WT are moved in a scanning exposure. The moving blades are controlled to move according to a desired scanning profile.

At the end of a scanning cycle, the blades are arranged to block the light source, thus preventing the light source from impinging on the patterning device. When a scanning cycle begins, the blades are controlled to move so that the light source impinges on the patterning device. The dimensions of the light source determine what is referred to as the scanning slit. The dimensions of the scanning slit are, in particular, determined by the optical source and the quartz rod. The scanning slit width in the Y-direction, which is conventionally the scanning direction, is variable and will be chosen depending on factors such as the dimensions of the mask to be exposed. The blades are accelerated to the scanning width as quickly as possible. Typical accelerations of the blades are in excess of 10 m/s/s and up to the region of 45 m/s/s. In an open position, the Y-blade assembly is scanned at a predetermined scanning speed, typically in excess of 500 mm/s, across the mask.

Once the mask has been scanned, the blades are moved to be arranged so as to block the light source, and thus prevent the light source impinging on the patterning device. This may be done, for example, by accelerating the open blades towards each other, in order to block the slit as quickly as possible. Alternatively, only one of the blades may be moved in the scanning direction to block the slit. For example, the trailing blade may be moved in the direction of the scan or the leading blade may be moved in the direction opposite to the scanning direction towards the trailing blade. The movements of the blades are not however limited to the example described above, and the blades of the present invention may be controlled to move according to any predetermined scanning profile. If desired, the blades may also be held stationary, either closed or at a constant slit width.

The control mechanism for the blades includes a driver 8 for generating high level commands, which are fed to a motion controller 7. Typically, the driver 8 is a software driver. From the high level commands, the programmable motion controller 7 generates control signals which are fed to an amplifier 5 which generates a current in accordance with the control signals to drive motor windings 1. Also provided is a position measurement device 3, which provides data concerning the position of the blades 4a,4b,6a,6b. This data is fed back via the amplifier 5 to the motion controller 7.

At least a part of the motor to drive the blades is incorporated into the blades or the blade support member. As seen in FIG. 2, for example, each blade is provided with a motor 1,2 and a positioning measuring mechanism 3. The motor 1,2 comprises at least one motor winding 1, which does not come into contact with the blade it drives, and a magnet 2. The magnet 2 is mounted directly on an intermediate portion 19 around which the motor windings 1 are disposed. The intermediate portion 19 on which the magnet 2 is disposed resembles a "pan handle" of the blade support member for the X blades, and for the Y blades the magnet is integrated at the rear end of the blades, that is the end remote from the optical blade edge. The intermediate portion may be constructed out of the same material as the blade, however this is not essential. Also, it is not essential that the blade and the intermediate portion 19 be constructed from a single piece of material.

The blades may be supported by blade support members. Preferably, the blade support members for the Y-blades comprise non-contact bearings. The motors 1,2 described above are preferably non-contact linear motors. These features reduce the moving mass of the blades and enhance durability. Further, the use of non-contact bearings and motors reduce frictional forces, which in turn allows the blades to be subject to higher accelerations without causing disturbances to other components in the system. This also results in improved accuracy of the blade mobility, with the blades being able to be moved at higher speeds and accelerated at higher accelerations.

In FIG. 2, the action of the driver 8 is translated to the blades via the intermediate portion 19. The motor coils are preferably provided on the blade support and are arranged to surround the intermediate portion 19, rather than on the blades as is conventional. This arrangement provides the benefit that there are no moving cables and hoses, because the heat generating coils are disposed on a fixed frame. Thus, a longer lifetime is achieved. This arrangement also provides the additional benefit that no cables are required to be connected to the moving parts, there is no cross talk between motors driving the moving parts, and the lifetime of the apparatus is increased.

Preferably, magnet 2 is provided with the blade(s) which responds to the drive signal. It has been demonstrated that blades constructed and driven according to the present invention can support scanning at the wafer stage at speeds up to 550 millimetres per second, and can further be subject to a blade acceleration of 45 metres/second/second while maintaining a tracking error of less than 10 micrometres. By reducing the number of moving parts in the drive mechanism and on the blades themselves, an improved reliability has been observed. Also, slip for example, between moving parts has been eliminated.

Also, FIG. 2, which depicts a plan view of the mask table/holder MT (and mask MA), indicates the mask table MT location relative to an embodiment of the masking device MD. The mask table/holder MT is itself movable by means of positioning mechanism (not shown).

In one embodiment, the masking device MD may be provided on the mask table/holder MT and so the masking device MD moves with the mask table/holder MT because it is mechanically coupled to it. In other embodiments, the masking device MD may be coupled electronically, magnetically, or electrostatically to the mask table/holder MT. Preferably, the masking device is demountable. Alternatively, the masking device MD can be coupled to the long-stroke or short-stroke module of the positioning mechanism PM rather than the mask table/holder MT itself.

As depicted in FIG. 2, two pairs of blades 4a,4b,6a,6b may be used to provide selectivity in terms of the extent that the mask MA (or the patterned beam) is obscured using the masking device MD and are moveable in the directions indicated by the arrows. As can be seen from FIG. 2, the two blades 4a,4b are mounted perpendicularly to the blades 6a,6b via non-contact linear motors 1,2. The blades 4a,4b move together and apart in the Y-direction (Y-blades) and the blades 6a,6b move together and apart in the X-direction (X-blades). In FIG. 2 all four blades may be coupled via the motion controller 7 and the driver 8 to the motion controller and driver of the patterning device.

As previously described, it can be seen that the blades in general perform two types of movements. The first movements are movements to block or unblock one of the light source impinging on the patterning device or patterned beam. These movements include closing/opening movements in which the two blades of a pair move relative to one another so as to adjust the part of the mask or patterned beam which is obscured.

The second movements are tracking movements, in which both blades of a pair move by the same vector so as to keep track of movements of the mask table/holder MT. As already discussed, the tracking movements are carried out automatically when the blades are coupled directly to the mask table/holder MT.

It is further added that in the embodiments shown in FIGS. 1-4, during scanning, the X-blades may be configured to be stationary. However, the X-blades are not limited in this respect. Motors are provided in order to move the X-blades with respect to one another.

Figure 3A:
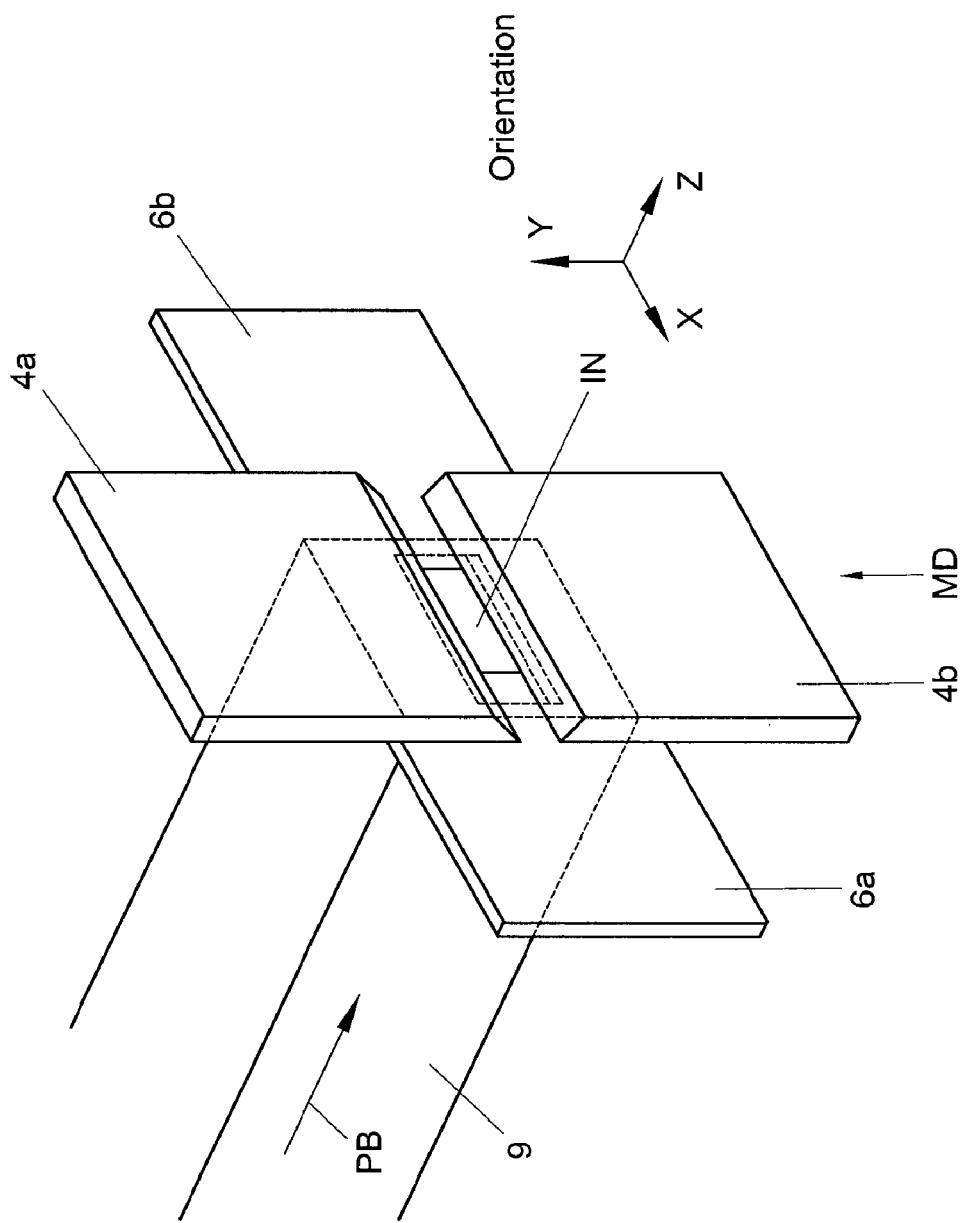
FIG. 3a shows a three dimensional overview of a masking device according to an embodiment of the invention.

FIG. 3a illustrates a three dimensional overview of the masking device MD. In particular, it is seen how the X-blades 6a,6b and Y-blades 4a,4b are disposed with respect to the integrator housing 9 (comprising, eg. integrator IN). In FIG. 3a, along the direction of the projection beam of radiation PB, the Y-blades 4a,4b are disposed downstream of the X-blades 6a,6b. In the embodiment shown, the X-blades are constructed to withstand the thermal impact of the projection beam PB. However, in an alternative embodiment, the Y-blades 4a, 4b may be disposed upstream of the X-blades 6a,6b. FIG. 3a enables the shapes of the slit forming blades to be seen.

Figure 3B:
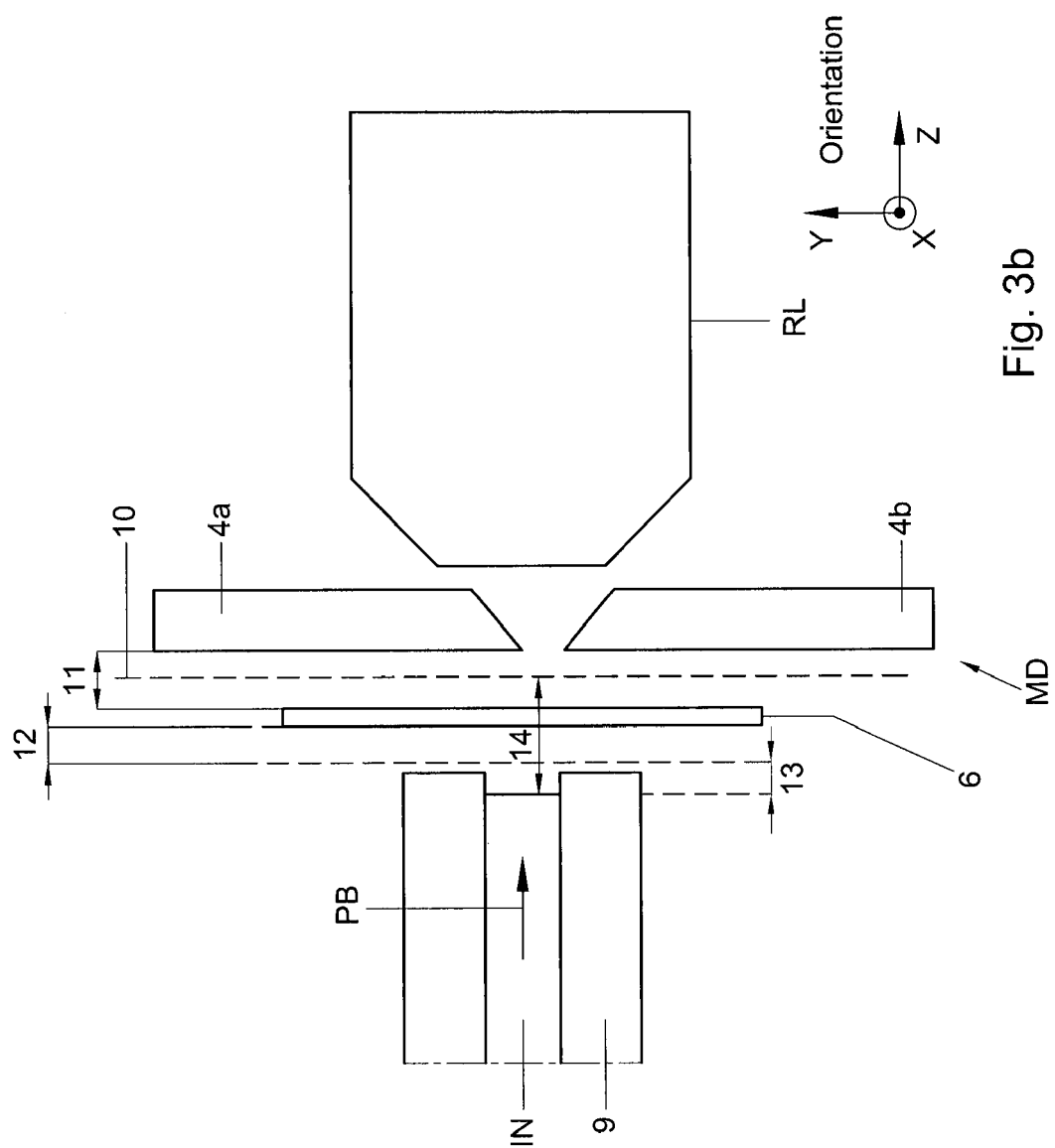
FIG. 3b shows a cross section in the YZ plane of part of the lithographic apparatus shown in FIG. 1 showing masking blades according to an embodiment of the invention.

FIG. 3b shows a cross section in the YZ plane of part of the lithographic apparatus shown in FIG. 1 showing the masking device MD according to an embodiment of the invention; With reference to FIG. 3b, the masking device MD of the present invention and, in particular, features of the blades and their arrangements with respect to each other and other components of the lithographic apparatus are described in further detail.

According to certain aspects of the present invention, the construction and arrangement of the two sets of blades results in a decoupling of the two sets of blades from one another and from mechanical coupling of the blades to the frame. In an embodiment of the invention, the blades float on air bearings, rather than being mechanically coupled to the frame. Thus, the Y blades, in particular, are not subject to disturbances from the X-blades or from the frame, such as vibrations.

In particular, and in contrast to conventional masking devices, the X and Y blades are constructed to be arrangeable so that their position and mobility is not directly determined by the position and mobility of the other set of blades. Uncoupling the blades results in a minimization of the moveable mass. Whereas conventional movable blades weigh in excess of 600 grammes, blades according to the present invention weigh in the order of 100 grammes. This has been achieved by the use of inter alia a direct drive, where the magnets of the driving motor are integrated into the blade or blade support member, and the mechanical decoupling of the two sets of blades from each other.

FIG. 3b shows the integrator IN, which is preferably a quartz rod, mounted in integrator housing 9. Also shown is the masking device MD disposed downstream of the integrator IN in the direction of the projection beam PB. A portion of the relay optics RL is also shown disposed downstream of the masking device MD. The mask MA (not shown) to be exposed is disposed downstream of the relay optics in the direction of the projection beam PB. The masking device MD comprises two sets of blades 4, 6 arranged to selectively obscure part of the mask MA from the radiation beam. The Y blades 4 are movable together and apart in the Y-direction, which is also the direction of scanning of the mask. In principle, the X-blades 6 are not moved with respect to each other during a scan. Thus, the distance between the X-blades during a scan is constant. However, the X-blades 6 may be moved with respect to each other if required by the scan profile, as determined by the width of the image on the mask.

Figure 8:
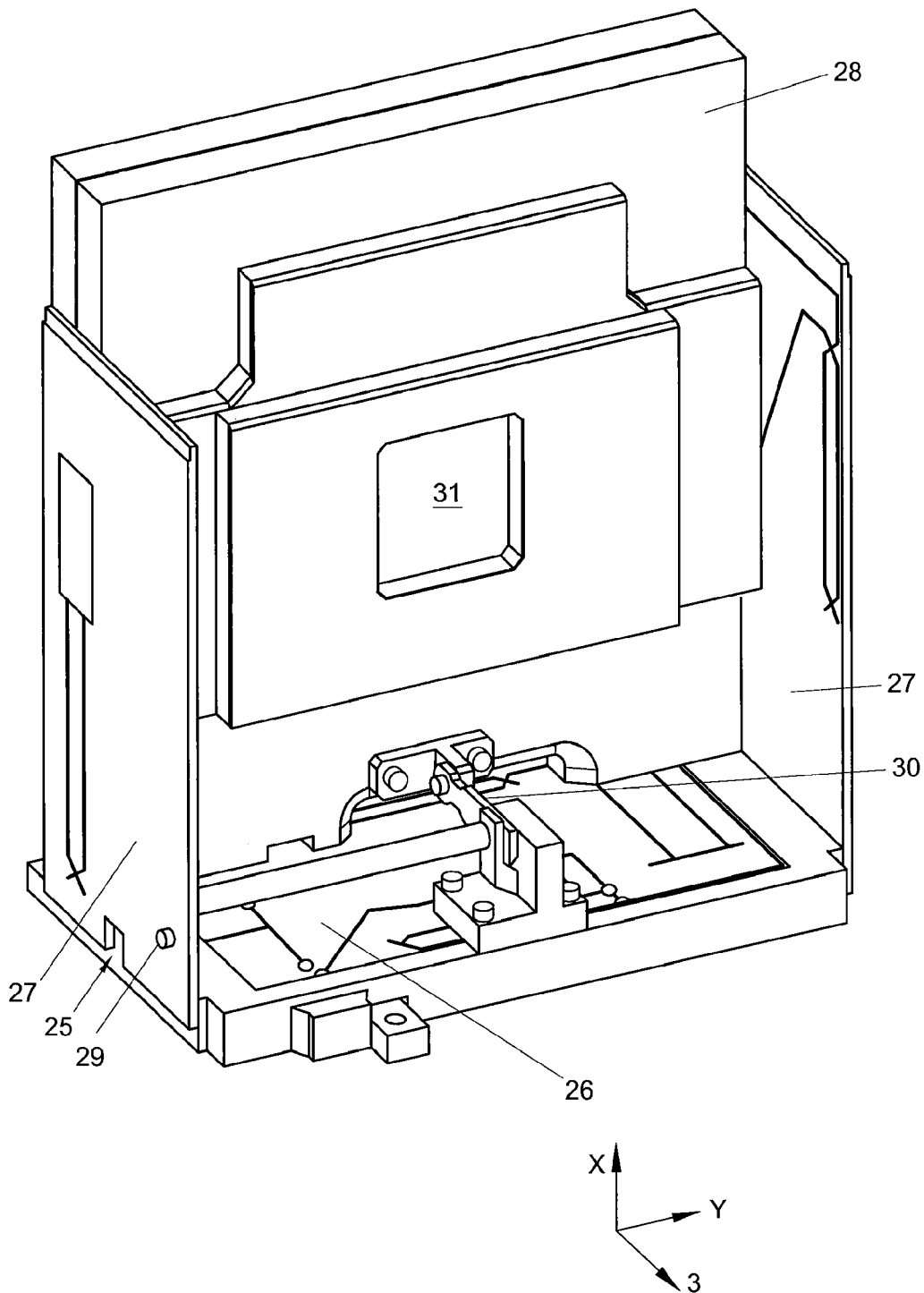
FIG. 8 shows details of a Z manipulator integrated in an X and Y assembly supporting frame according to an embodiment of the invention.

It will be appreciated that the position of the masking device MD with respect to the radiation system and the mask is important. The radiation system LA, Ex, IL generates a beam having a focal plane 10, corresponding to a plane substantially conjugate to the filed plane of the mask, at a predetermined location depending on the optical components of the radiation source, illuminator and relay optics. Although FIG. 3b shows the focal plane at location 10, the focal plane may vary. In which case adaptation of the position of the blades in the Z-direction with respect to the focal plane may be necessary, preferably, using a Z manipulator as shown in FIG. 8.

In conventional masking devices, all blades have a certain thickness which is necessary in order for the mechanical stability of the blades and for them to be able to withstand the thermal load which the blades are subjected to by the radiation which they block. A consequence of this is that, in conventional masking devices, all blades are coupled together and must be disposed in the focal plane of the beam. As such, it is not possible to decouple the X and Y blades because their thickness precludes them from both being disposed within the critical limits of the focal plane. The inventors of the present invention have found that it is possible to dispose the blades not directly in the focal plane yet still be able to project sharp optical edges of the slit onto the mask.

In particular, if the end of the quartz rod is disposed at one end of the margins of the focal plane in the Z-direction and the Y-blades are disposed at the opposite end of the margin in the Z-direction, it has been found that space is provided to dispose the X-blades in a mechanically decoupled manner from the Y-blades, while still allowing a sharply focused slit to be projected on to the patterning device. Preferably, however, for optimum masking the blades are disposed within a certain distance of the focal plane 10 of the beam, which is preferably in the order of 50 micrometers.

In FIG. 3b, the stationary blades 6, also referred to as the X blade, are preferably disposed at a distance less than 200 micrometres, and preferably within a distance 11 of approximately 100 micrometres from the movable blades 4. The focal plane 10 in the example shown lies between the stationary and the movable blades. Associated with the integrator IN are tolerances. The distance between the downstream end plane of the quartz rod of integrator IN and the integrator housing 9 plus tolerances is shown by arrow 13. The stationary blades are disposed a distance 12 from the end of the quartz rod plus tolerances 13. Preferably, the distance 12 is less than 100 micrometres. The distance between the end of the quartz rod and the focal plane of the beam is shown by arrow 14, and is typically of the order of 300 to 600 micrometres.

As seen from FIG. 3b, the stationary blades during scanning, (e.g., X blades) are of a thinner construction than the movable blades during scanning (e.g., Y blades) and that the stationary blades are disposed in the beam upstream of the movable blades. This construction is discussed in more detail hereinbelow. The invention is not limited to the example given below. It is envisaged that the stationary during scanning blades may alternatively be thick and the moving during scanning blades may alternatively be thin.

The masking device MD, and in particular the blades, are subject to large thermal stress from the projection beam radiation. As mentioned above, the thermal load on the blades is a reason why blades in conventional masking devices have a large thickness, of the order of 1 to 3 millimeters. In addition, cooling of conventional blades is limited. The energy of the radiation blocked by the masking device is a problem for masking devices because it can affect the apparatus components and the blades themselves. To address this problem, the blades may be provided with a surface which is reflective to the projection beam radiation. In one example, the blades may be provided with an ultra violet reflecting coating. This alone, however, may not be sufficient, and in addition, may not be permitted for all light source wavelengths envisaged to be used with the present invention.

It has been found that by providing sufficient cooling mechanism to the blades, in particular, to the upstream blades (i.e., the stationary X-blades) in the example shown in FIG. 3b, the thickness of the blades can be reduced. In one embodiment, the stationary blades are asymmetrically cooled with respect to the moving blades, i.e. the amount of cooling applied to the stationary, or upstream, blades is different from that applied to the other set of blades, and preferably the amount of cooling is greater. It has further been discovered that by cooling the X-blades to a sufficient degree, the thickness of the X blades can be reduced. If the cooling is sufficient, the X-blades are made sufficiently thin, so that there is enough space to allow the Y-blade to be downstream of the X-blade while still lying within the sufficiently small distance of the focal plane to allow a sufficiently sharp slit to be projected onto the patterning device.

According to an embodiment of the present invention, cooling ducts are provided in the blade support member. Such ducts allow conventional air hoses to be dispensed with. The ducts may have various configurations and may be used for supplying various coolants, such as air and/or water, in order to cool. For cooling, ducts are provided in the blade support member. Coolant is fed from an inlet provided on the support member to an outlet via the ducts. The outlet preferably comprises an opening provided in the support member. The ducts are preferably disposed adjacent the blade to be cooled. The water is circulated via the ducts underneath the blades to an outlet also preferably provided on the frame. Cooling of the masking device MD is described in more detail with reference to FIGS. 6 and 7 below.

In view of the harsh environment in which the blades are disposed, the choice of material for the blades, in particular, the X-blade is important. The choice material for the X and Y blades provides an optimum combination of thermal expansion co-efficient (alpha), thermal conductivity (lambda), wear resistance and reflection co-efficient for ultra violet and deep ultraviolet radiation.

Accordingly, blades shown in the figures maybe made of, for example, a ceramic or diamond material. Preferred materials for the blades are chemical vapour deposition diamond (CVD diamond), aluminum, tungsten copper alloy and silicon carbide, all of which exhibit a good combination of the required properties. In particular, CVD diamond is preferred. The thickness of the X-blade is preferably in the order of approximately 0.4 mm in the direction of the projection beam.

In addition to those properties mentioned above, it is important that the material of the X- and Y-blades has a high Young's modulus and low density, in order that the blades while being stiff are as light as possible, in order to reduce the moving mass of the blades. The Y-blade shown in the figures may be made of, for example, aluminium or an aluminium beryllium alloy (AlBe). Preferred materials for the Y-blades include metal matrix composites, ceramics, diamond, beryllium alloys and graphite. The thickness of the Y blades is in the order of 6 mm. However, in addition to those materials mentioned above, the blades can also be made of any appropriate material, which in general comprise materials that can withstand the radiation, are rigid and lightweight, or can be provided with coatings having these properties. Further, some materials, such as certain ceramics have the advantage that it can include one or more cooling channels in it, as described in European Application Number 00304336.1 (applicant's ref: P-0183) which is hereby incorporated herein by reference, to remove heat due to incident radiation.

It has been found that an anti reflective coating on non-polished surfaces of the blades cuts down unwanted reflections in the masking device assembly. This results in an improvement in the accuracy of the patterning of the beam.

FIG. 4 illustrates a cross-section of the masking device of FIG. 2 in the Y-Z plane. In particular, FIG. 4 shows the stacking of the X and Y blades. The X-blade 6 is shown in plane. The masking device MD is disposed above the mask. In addition in FIG. 4, it is seen that the X-blade 6 is mounted on a blade support member 15, on which a heat sink 16 is provided. A clamping device 17 is provided to clamp the X blade to the heat sink 16, so that good thermal contact between the X blade and the heat sink promotes cooling of the X blade. In one embodiment, the masking structure comprises a blade mounted on the blade support, wherein a layer 18 of material having a high thermal conductivity is disposed between said blade and said blade support.

Figure 5:
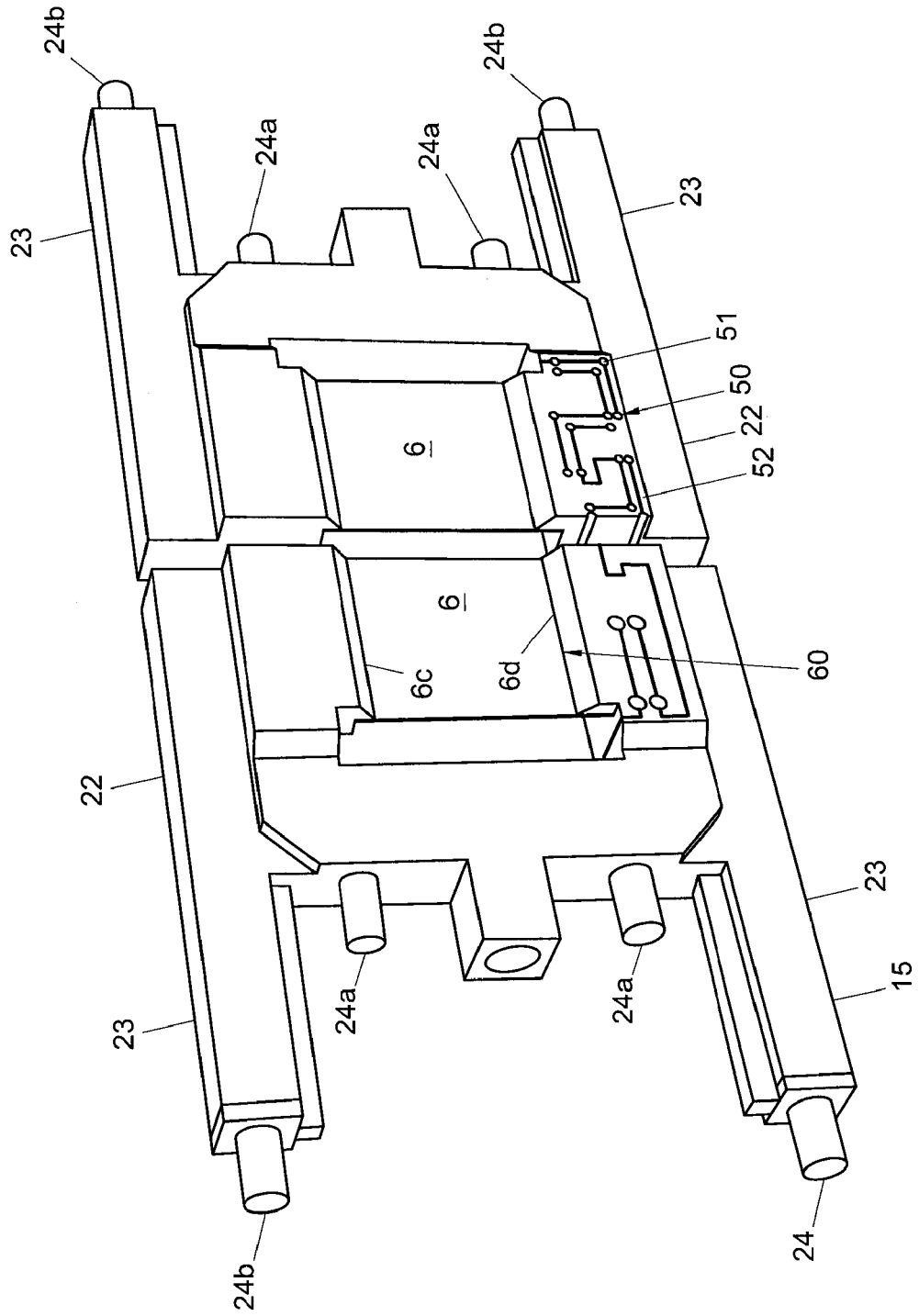
FIG. 5 shows X-blades of the masking device mounted on a support member according to an embodiment of the invention.

FIG. 5 shows the X blades 6 mounted on a first blade support member 15, which provides support to the blades. The support member 15 comprises a U-shaped member 22, wherein opposite edges 6c, 6d of each blade are supported by opposite arms of the U-shaped member. The support member 15 also includes portions 23 extending from the bottom of each corner of the U-shape. To support two blades, two U-shaped members together form an H-shaped member. Cooling mechanisms 24a are provided in the support member 15. In particular, liquid, for example, water, cooling is provided by cooling ducts 24a, although, the ducts could also be used for gas cooling. In one embodiment, ducts 24b may supply gas to the gas bearings of the X blades. It is to be noted that the gas supplied by ducts 24b also contributes to cooling of the blades. In the embodiment shown in FIG. 5, the gas ducts 24b are disposed further from the blade than the water cooling ducts 24a. In particular, the gas and liquid ducts 24a, 24b are substantially parallel ducts disposed on opposite sides of support member 15.

In addition to, or optionally to the cooling mechanism described above, the support member 15 may be provided with additional features which enable the masking device to exhibit an improved reaction to thermal stress, including thermal cycling. Support member 15 may be provided with movement limiting mechanism 50, which minimize movement of the support member, such as flexing, bending etc, during thermal stress. The movement limiting mechanism 50 comprise features 51, 52 formed in the support member 15. The features may take various forms and configurations. In the embodiment shown in FIG. 5, the features comprise slots 52 joined at hinges 51. The hinges 51 are formed by holes bored into the support member 15. The features provide the structure with a certain degree of flexibility. It has been shown that by arranging the movement limiting mechanism in a particular way, the support member's reaction to thermal stress is moderated significantly. The dimensions and configurations of the features, such as the slots and wings will depend on factors such as the materials of the support member and the thermal stress characteristics. Also provided on the support member 15 are clamping device 60. The clamping device comprises one or more fingers which extend from the support member 15 to clamp the blade.

Figure 6:
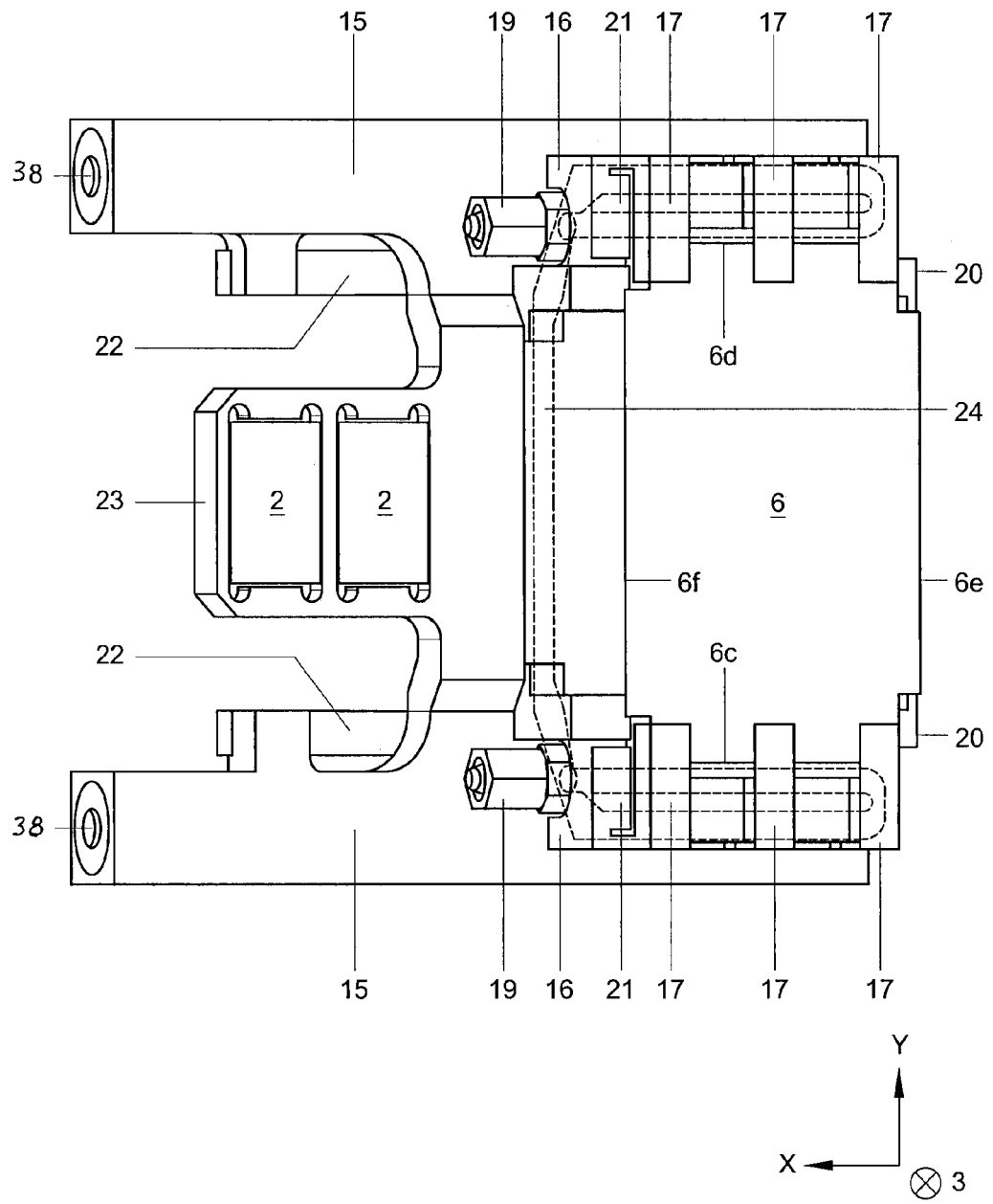
FIG. 6 shows detail of a X-blade mounted on a support member according to an embodiment of the invention.

FIG. 6 depicts further embodiments of the X-blades mounted on a first support member 15. As described with reference to FIG. 5, opposite edges 6c, 6d of the X-blade 6 are mounted on opposite arms of the U-shaped support member 15. The motor magnets 2 are mounted on a magnet support member 23. The magnet support member 23 comprises a portion disposed between the opposite arms of the U-shaped support member 15. In FIG. 6, the two magnets 2 are shown, which are part of the motor (not shown in its entirety) which drives the blades.

Also provided on support member 15 is a cooling structure 16, 19, 24. The cooling structure 16, 19, 24 comprises portions 16 mounted on each arm of the support member 15, inlet 19 through which coolants may be introduced into the coolant structure 16, 19, 24. The structure is provided with coolant ducts 24 (shown in dotted lines) extending through the coolant structure, preferably along the length of the coolant structure. Also provided is a connecting conduit for connecting the coolant ducts in each cooling portion 16 mounted on each arm of the support member 15. One of the cooling inlets 19 may also function as a cooling outlet 19 to allow the circulated coolant to leave the structure 16, 24. The cooling mechanism may provide cooling by various fluid coolants, both gases and liquids. A preferred coolant is water.

The portions of the cooling structure are provided on the supporting member 15 to preferably align with the opposing edges 6c, 6d of the X-blade, respectively. In the embodiment shown in FIG. 6, the X-blade is supported directly by the cooling structures 16. However, the invention is not limited in this respect, and the X-blades may be supported by the frame of the support member.

Also provided on the support member to clamp the blade in place is a clamping device 17. The clamping device 17 comprises a plurality of resilient structures arranged in use to attach to a surface of the X-blade along the edge 6c, 6d of the X-blade in the X direction. The resilient structures comprise an L shaped spring which exerts a force downwards through the blade in the Z-direction. Lateral movement in the X-direction is prevented by the provision of a further clamping device 20, 21. Clamping device 20, 21 comprises a stop 20 and a resilient structures 21 disposed at opposite edges 6e, 6f of the X-blade in the X-direction, wherein resilient structures 21 is arranged to exert a force on the X-blade in the X-direction towards stop 20. The resilient structures 21 may comprise a spring and the stop 20 may comprise a fixed anvil.

In FIG. 6 resilient structures 21 is configured from a flat portion material. An L-shaped cut is provided in the flat piece of material to provide resiliency. It will be appreciated that the resiliency of the clamping device can be determined according to the choice of material and the dimensions of the cut in the portion. It has been found that the combined clamping effect in the Z-direction by clamping device 17 and in the X-direction by clamping device 20, 21 provide stable and accurate retention of the X-blade. In particular, the X-blade is prevented from moving forward in the X direction.

It has been found that it is desirable to provide good thermal conductivity between the X-blade, which is subject to large thermal stresses, and the slider, and that clamping of the blade to the slider must be effective and secure regardless of any thermal expansion experienced by the slider, the blade and any clamping components. For the Y-blades, the term "slider" refers to the Y-blades themselves. For the X-blades, the term "slider" refers to the blade support member, of which the blades are a part. It has further been found that satisfying these two conditions causes problems in conventional masking assemblies.

To overcome this problem, in one embodiment, a double sided clamping mechanism is provided as shown in FIG. 6. In this embodiment, the X-blade is clamped with clamping devices 17 on both sides of its support member 15, as discussed above. Clamping device 17 clamps the upper surface of the X-blade. This arrangement provides the advantage that thermal expansion of the clamping and clamped components is compensated equally in the X-direction, while keeping the blade securely clamped, and hence accurately aligned. In a further preferred embodiment, a layer of silver foil is disposed between the blade and the cooling body. The silver layer has good thermal conductivity.

This arrangement provides a further particular advantage of reducing the hot spot temperature while maintaining good thermal contact between the blade and the cooling body. The hot spot is defined as being the center of the blade, and is located in the vicinity of reference number 6. The arrangement shown in FIG. 6 allows the blade to expand in the Y-direction between clamps 17 disposed on either side. This means that under thermal load, the front edge of the blade 6e remains substantially in the same position in the X-direction, thus maintaining a sharp shadow projection. Thus, under thermal load, the X-blade exhibits almost no noticeable deterioration in the accuracy of its masking performance.

Also shown in FIG. 6 are blade dampers 38 disposed on the respective ends of opposite anus of the support member 15, which are in the form of buffers, which function to lessen or absorb the shock of any disturbance exerted on the support member 15. The support member 15 is also provided with gas bearings (not shown) on the rear side of the support member. Also provided are gas bearing preload strips 22, which are used to preload the gas bearing provided on the support member 15. The gas bearing preload strips 22 are preferably made of a metal, such as iron. In the housing in which the masking device is disposed, adjacent the support member 15, in the stationary portion of the housing, there is provided magnets which can form part of the gas bearings. The magnets are arranged in the housing so as to exert a force on the preload strips 22. The gas bearing exerts an opposite force to that exerted by the magnets. Thus, by providing a constant magnetic force and a constant gas pressure, a well defined stiffness of the gas bearings is achieved.

Figure 7:
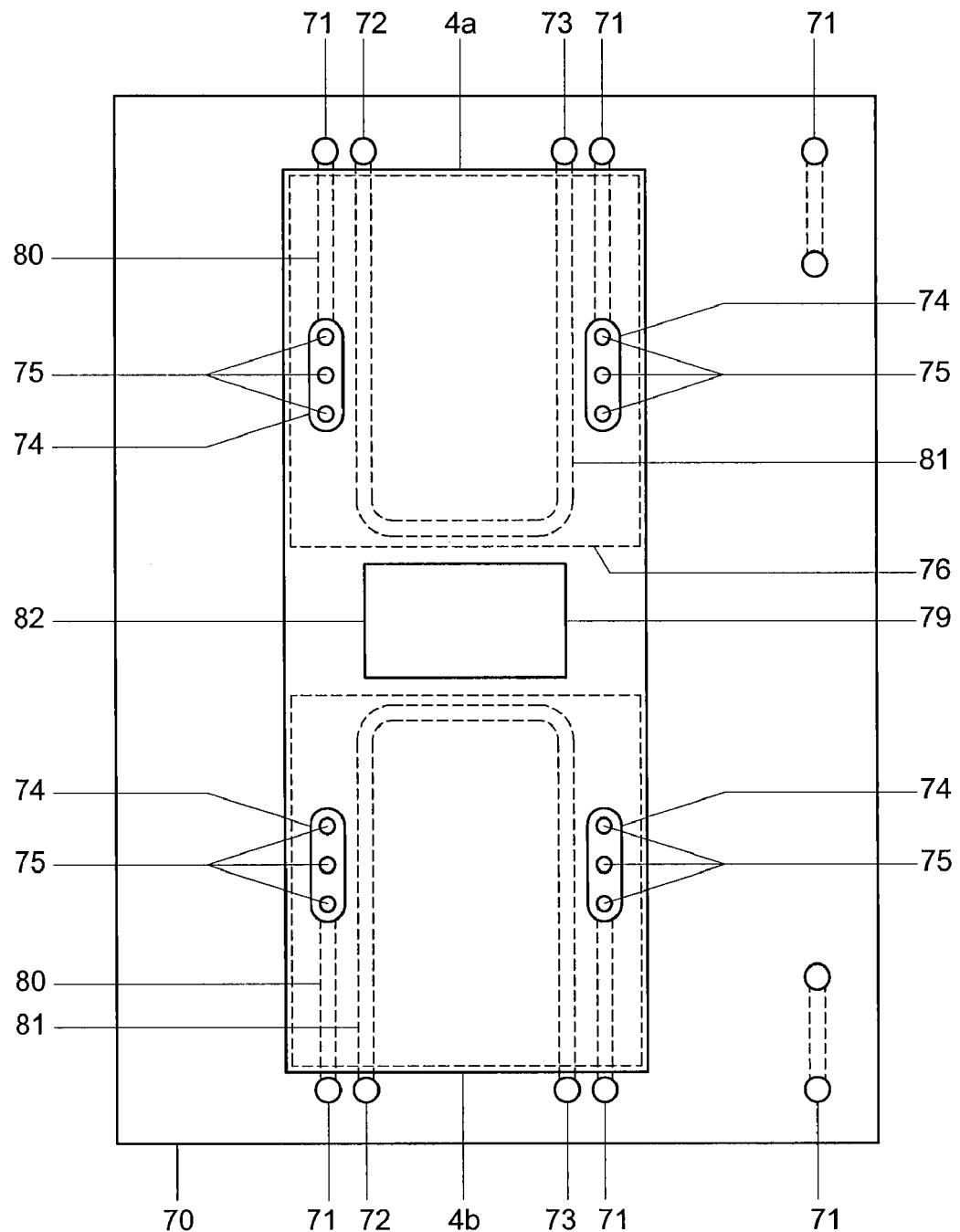
FIG. 7 shows a plan view of a support member for Y-blades according to an embodiment of the invention.

FIG. 7 provides a plan view of a second support member 70 for the Y-blades 4a, 4b showing in particular a gas bearing which is in use supports the Y-blades and the cooling structures. Y-blades 4a and 4b are shown in dotted outline disposed in a recess 79 formed in the second support member 70. Also shown in the centre of the recess 79 is an outline of a through hole 82 formed in the support member 70 through which the projection beam passes (and over which the Y-blades move in part).

Also shown in FIG. 7, are details of the gas bearing which supports the Y-blades. A gas inlet 71 is provided in the support member 70. Gas is introduced through the inlet 71 and passes through duct 80 formed in the support member 70. A slightly raised portion 74 is formed on the floor of the recess 79. The duct 80 is connected to openings 75 formed in the raised portion 74. When gas is introduced into inlet 71 the Y blade disposed in recess 79 is supported by the gas leaving openings 75. In use, the Y-blade is uncoupled from the support member 70. Thus, it is not susceptible to friction between it and the support member 70. This allows the Y-blades to be moved using less energy, and thus allows the Y-blades to be accelerated at increased rates. As shown in FIG. 7, a plurality of gas bearings may be provided. The Y-blades are mechanically isolated, in use, from the machine.

The scanning Y blades require cooling. The blades are guided with gas bearings as described above. The second supporting member 70 comprises a gas bearing surface 76. The gas bearing surface is stationary and is fluid cooled by a cooling system 72, 73, 81. The Y-blades are also cooled by the cooling system 72, 73, 81. Fluid coolant, preferably water, is introduced through inlet 72 formed in support member 70. The fluid is fed to outlet 73 formed in the support member 70 via a duct 81. The duct is preferably configured in the support member 70 to transverse the width of the Y-blade when disposed in said recess. In use, the gas bearing causes the Y-blade to be raised above the floor of the support structure by approximately 10-20 micrometers. Heat conduction takes place from the blades through the gap formed between the underside of the blades and the gas bearing surface 76 of the cooled gas bearing. The advantage of this particular arrangement is that the Y blades can be satisfactorily cooled without the provision of gas or liquid hoses connected to the moving blade. This benefits the lifetime and accuracy of the masking device, as well as reduces the moving mass of the Y-blade assembly.

In a further embodiment, the X-blades are controlled to act as a heat shield in the case of the Y-blades becoming overheated. For example, if the Y-blades are disposed in a closed arrangement, while the X-blades are disposed in an open or partially open arrangement, the projection beam will impinge fully or partially (depending on the distance between the X-blades) on the Y-blades. This may cause the Y-blades to overheat. However, in addition it may cause the gas bearing described with reference to FIG. 7 to be damaged. To prevent this from occurring, the X-blades are controlled to move to block the light impinging on the Y-blades. In particular, for a particular dosage, if light impinges on the Y-blades for longer than a predetermined time duration, the controller will cause the X-blades to move into a position which shades the Y-blades from the optical source. In this way the X-blades function as a thermal shield to protect the Y-blades. As described previously, the X-blades are constructed to be robust with respect to the projection beam, being able to withstand the full impact of the projection beam without suffering adverse effects.

It will be appreciated with reference to FIGS. 5, 6 and 7, that the first and second masking structures are arranged in the apparatus, mechanically uncoupled with respect to each other. In particular, the first and second support members are mechanically uncoupled. Preferably, the X-blade and Y-blade assemblies are modular units. The X-blade assembly and the Y-blade assembly are two separate modules that are assembled and tested independently from one another. The complete modules are assembled with respect to one another as shown in FIGS. 2-4 and 8 for use. To do this, certain parts of the X-blade assembly and Y-blade assembly are coupled to each other. However, it is not necessary to couple the X blades with respect to the Y blades. This provides an advantage that disturbances including vibrations caused by the movement of the X blades do not affect the Y-blades, and vice versa. Thus, the masking assembly is easier to assemble and test than conventional assemblies. In particular, separate components can be assembled and tested without having to disassemble the entire assembly. This saves time and man hours.

It has been found that during operation electrostatic charge may build up in the lithographic apparatus. This may have a detrimental effect on certain sensors and electronic circuits. To overcome this problem, in another embodiment, with reference to FIG. 2, at least one of the blades is provided with an electrostatic discharge rod 39 which conducts electrostatic charge towards it, and, thus, away from sensitive sensors and electronics. This arrangement has an advantage of protecting electrostatic sensitive components. The rod 39 may be disposed on either the X or the Y or both blades (as shown in FIG. 2). However, preferably, the rod is disposed on the Y blades. Preferably, it comprises a thin tapered rod mounted on one of the blades. Its dimensions and material are chosen to provide optimum electrostatic conduction while having a minimum mass. The rod 39 may, by way of example, be made of copper.

The motors for driving the blades are controlled by software which comprises a list of instructions to control the motors. In conventional blade assemblies, it is not uncommon for blades to collide with each another. This may not only damage the blades but will affect production if the apparatus is shut down for repairs. In a preferred embodiment, sensors are provided which detect the position of the blades and provide feedback to the control mechanism. The software which provides the instructions to the motors is adapted to take account of the sensed position data, and is designed to preclude the possibility that the blades come into contact with each other. In this way, the control software which drives the motors prevents collision of the moving X or Y blades, and further collision between an X and a Y blade.

As mentioned previously with reference to FIGS. 3a and 3b, it may be necessary to adjust the position of the blades in the Z-direction in order to align the blades correctly with respect to the focal plane and other components. Conventionally, this is achieved by moving the entire assembly comprising the X and Y blade assemblies over the frame that supports them. This is inconvenient and cumbersome.

FIG. 8 shows an embodiment of the present invention detailing features which overcome this problem. In particular, FIG. 8 shows a manipulator screw 25 for manipulating the position of the X and Y blades in the Z-direction, that is in the direction of the optical axis. A frame 27 is provided within the X and Y assemblies as shown in FIGS. 6 and 7, respectively, are mounted. The X and Y assemblies are denoted by reference numeral 28 in FIG. 8, and are supported by frame 27. The projection beam projects through opening 31 in the Z direction. It is seen that the Z-manipulator screw 25, when turned, exerts a force on a base plate 26, which is provided with manipulator hinges. The frame 27 supporting the X and Y (sub) assemblies remains fixed on its own supporting frame. Preferably, the Z-direction manipulator 25 is integrated in the frame 27.

In particular, the Z manipulator is an adjusting mechanism that comprises a screw 25 which acts on a resilient member which, in turn, exerts force in the Z-direction on the X- and Y-assemblies 28. Also provided, is a Z manipulator locking screw 29 and a further Z manipulator locking device 30, which maintain the X- and Y-assemblies in the desired location in the Z direction once the desired position has been achieved.

It has been found that it is important that the blades, in particular the X-blade which is usually disposed upstream of the Y-blade, does not come into contact with the end of the quartz rod of the integrator IN, because if it were to, the quartz rod may become damaged. To overcome this problem, a sensor is provided in the vicinity of the downstream end of the quartz rod to sense if the blade comes within a predetermined distance of the exit surface of the quartz rod. If the sensor detects that the blade is within the predetermined distance of the exit surface, the detected signal may be used by an operator to control the Z manipulator to move the blade away from the exit surface in the Z direction. This arrangement improves the reliability of the apparatus, and reduces the risk of damaging the integrator IN.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:
1. A lithographic apparatus, comprising:
an illumination system configured to condition a beam of radiation, said illumination system defining a focal plane through which the beam of radiation passes;
a support structure configured to support a patterning device at a location, said patterning device serving to pattern the beam of radiation according to a desired pattern;
a masking device configured to obscure at least a part of the patterning device from the beam, the masking device comprising a first masking structure arranged to obscure said part in a first direction relative to said location and a second masking structure arranged to obscure said part in a second, different direction relative to said location, wherein said first and second masking structures are disposed in the vicinity of the focal plane in a mechanically uncoupled arrangement relative to each other to substantially prevent transfer of vibration from one of the first and second masking structures to the other;
a substrate holder configured to hold a substrate; and
a projection system configured to project the patterned beam onto a target portion of the substrate,
wherein during projection of the patterned beam onto the target portion of the substrate, said second masking structure is moved by a motor while said first masking structure is stationary, and wherein said first masking structure is of a thinner construction than said second masking structure.

2. The lithographic apparatus of claim 1, wherein each of said first and second masking structures is supported on respective separate first and second support members.

3. The lithographic apparatus of claim 2, wherein said first masking structure comprises a blade mounted on the first support member, wherein a layer of material having a high thermal conductivity is disposed between said blade and the first support member.

4. The lithographic apparatus of claim 3, wherein said material is silver.

5. The lithographic apparatus of claim 2, wherein said second masking structure is supported on said second support member by a gas bearing.

6. The lithographic apparatus of claim 5, wherein said gas bearing is configured to cool said second masking structure.

7. The lithographic apparatus claim 5, wherein, in use, heat is conducted from said second masking structure via a gap provided by said gas bearing between said second masking structure and said second support member.

8. The lithographic apparatus claim 2, wherein said support members are provided with an adjustment mechanism configured to adjust the position of said first and second masking structure in the direction of the beam.

9. The lithographic apparatus of claim 8, wherein said adjustment mechanism comprises a screw which acts on a resilient member, said screw and said resilient member being mounted on a frame.

10. The lithographic apparatus of claim 2, wherein said first masking structure includes a blade and said apparatus further includes a clamping device provided at two opposite ends of the blade that clamp said blade to said first support member such that said blade is supported at said opposite ends by said first support member.

11. The lithographic apparatus of claim 10, wherein said first support member includes a heat sink, and the clamping device is configured to clamp the blade to the heat sink.

12. The lithographic apparatus of claim 1, wherein said first masking structure is provided with a cooling mechanism.

13. The lithographic apparatus of claim 12, wherein said cooling mechanism comprises a cooling structure which is incorporated into a support member on which said first masking structure is supported.

14. The lithographic apparatus of claim 13, wherein said cooling structure includes an inlet through which a cooling fluid can enter, a cooling duct through which said cooling fluid can pass, and an outlet through which said cooling fluid can exit said cooling structure.

15. The lithographic apparatus of claim 12, wherein said second masking structure is provided with a cooling mechanism and wherein, in use, said first masking structure and said second masking structure are cooled to a different degree with respect to each other.

16. The lithographic apparatus of claim 1, wherein said first masking structure comprises a blade having a thickness in the direction of the beam of less than approximately 0.5 mm.

17. The lithographic apparatus of claim 1, wherein said first and second masking structures comprise first and second pairs of moveable blades, respectively.

18. The lithographic apparatus of claim 1, wherein said first masking structure comprises a plate made of one of the materials selected from a group comprising: chemical vapor deposition diamond, aluminum, tungsten copper alloy, and silicon carbide.

19. The lithographic apparatus of claim 1, wherein said first and second masking structures are driven by non-contact linear motors, respectively.

20. The lithographic apparatus of claim 19, wherein said second masking structure is provided with a magnet which forms part of said respective non-contact linear motor.

21. The lithographic apparatus of claim 19, wherein said first masking structure and said second masking structure are modular units.

22. The lithographic apparatus of claim 19, wherein said first masking structure, or said second masking structure, or both said first and second masking structures, is provided with an electrostatic discharge device.

23. The lithographic apparatus of claim 22, wherein said electrostatic discharge device comprises a rod mounted on a blade of said first masking structure, said second masking structure or both said first and second masking structures, so as to direct an electrostatic charge away from particular components of the apparatus.

24. The lithographic apparatus of claim 1, wherein said first and second masking structures comprise a pair of blades arranged to move together and apart in a X- and Y-direction, respectively.

25. The lithographic apparatus of claim 1, wherein said first masking structure, when disposed in a closed position, acts as a shutter to protect said second masking structure from said beam.

26. The lithographic apparatus of claim 1, comprising a control mechanism configured to control a pair of blades of said first or second masking structures to prevent collision between each blade.

27. The lithographic apparatus of claim 1, wherein the second direction defines a scanning direction in a Y-direction, and the first direction defines a non-scanning direction in a X-direction, said X-direction being substantially perpendicular to said Y-direction.

28. The lithographic apparatus of claim 1, wherein any of said masking structure is provided with an anti-reflective coating.

29. The lithographic apparatus of claim 1, wherein the distance between the first masking structure and the second masking structure is less than 200 micrometers.

30. The lithographic apparatus of claim 1, wherein the first and second masking structures are positioned within a small distance of the focal plane to allow a sufficiently sharp slit to be projected onto the patterning device.

31. A device manufacturing method, comprising:
providing a substrate that is at least partially covered by a layer of radiation-sensitive material;
conditioning a beam of radiation using an illumination system;
patterning the beam of radiation with a patterning device, said patterning device disposed at a location;
projecting the patterned beam of radiation onto a target area of the layer of radiation-sensitive material; and
selectively obscuring part of said patterning device from said beam or said patterned beam by using a first masking structure to selectively obscure said part in a first direction with respect to said location, and using a second masking structure to selectively obscure said part in a second different direction with respect to said location, wherein said first masking structure and second masking structure are disposed in the vicinity of a focal plane of said beam or patterned beam in a mechanically uncoupled arrangement with respect to one another to substantially prevent transfer of vibration from one of the first and second masking structures to the other, wherein during projection of the patterned beam onto the target portion of the substrate, said second masking structure is moved by a motor while said first masking structure is stationary, and wherein said first masking structure is of a thinner construction than said second masking structure.

32. The method of claim 31, wherein the distance between the first masking structure and the second masking structure is less than 200 micrometers.

33. The method of claim 31, wherein the first and second masking structures are positioned within a small distance of the focal plane to allow a sufficiently sharp slit to be projected onto the patterning device.

34. A masking device to obscure at least a portion of a lithographic patterning device from a beam of radiation, said masking device comprising:
a first masking structure arranged to obscure a part of said patterning device in a first direction relative to a location where said patterning device is supported; and
a second masking structure arranged to obscure a part of said patterning device in a second, different direction relative to said location,
wherein said first and second masking structures are disposed in the vicinity of a focal plane of the beam in a mechanically uncoupled arrangement relative to each other to substantially prevent transfer of vibration from one of the first and second masking structures to the other and wherein during projection of a patterned beam onto a target portion of a substrate, said second masking structure is moved by a motor while said first masking structure is stationary, and wherein said first masking structure is of a thinner construction than said second masking structure.

35. The masking device of claim 34, wherein each of said first and second masking structures is supported on respective separate first and second support members.

36. The masking device of claim 35, wherein said first masking structure comprises a blade mounted on the first support member, wherein a layer of material having a high thermal conductivity is disposed between said blade and the first support member.

37. The masking device of claim 36, wherein said material is silver.

38. The masking device of claim 35, wherein said second masking structure is supported on said second support member by a gas bearing.

39. The masking device of claim 38, wherein said gas bearing is configured to cool said second masking structure.

40. The masking device of claim 38, wherein, in use, heat is conducted from said second masking structure via a gap provided by said gas bearing between said second masking structure and said second support member.

41. The masking device of claim 35, wherein said support members are provided with an adjustment mechanism configured to adjust the position of said first and second masking structures in the direction of the beam.

42. The masking device of claim 41, wherein said adjustment mechanism comprises a screw which acts on a resilient member, said screw and said resilient member being mounted on a frame.

43. The masking device of claim 35, wherein said first masking structure includes a blade and said apparatus further includes a clamping device provided at two opposite ends of the blade that clamp said blade to said first support member such that said blade is supported at said opposite ends by said first support member.

44. The masking device of claim 43, wherein said first support member includes a heat sink, and the clamping device is configured to clamp the blade to the heat sink.

45. The masking device of claim 34, wherein said first masking structure is provided with a cooling mechanism.

46. The masking device of claim 45, wherein said cooling mechanism comprises a cooling structure which is incorporated into a support member on which said first masking structure is supported.

47. The masking device of claim 46, wherein said cooling structure includes an inlet through which a cooling fluid can enter, a cooling duct through which said cooling fluid can pass, and an outlet through which said cooling fluid can exit said cooling structure.

48. The masking device of claim 45, wherein said cooling mechanism provides water cooling.

49. The masking device of claim 45, wherein said second masking structure is provided with a cooling mechanism and wherein, in use, said first masking structure and said second masking structure are cooled to a different degree with respect to each other.

50. The masking device of claim 34, wherein said first masking structure comprises a blade having a thickness in the direction of the beam of less than approximately 0.5 mm.

51. The masking device of claim 34, wherein said first and second masking structures comprise first and second pairs of moveable blades, respectively.

52. The masking device of claim 34, wherein said first masking structure comprises a plate made of one of the materials selected from a group comprising: chemical vapor deposition diamond, aluminum, tungsten copper alloy, and silicon carbide.

53. The masking device of claim 34, wherein said first and second masking structures are driven by non-contact linear motors, respectively.

54. The masking device of claim 53, wherein said second masking structure is provided with a magnet which forms part of said respective non-contact linear motor.

55. The masking device of claim 34, wherein said first and second masking structures comprise a pair of blades arranged to move together and apart in a X-and Y-direction, respectively.

56. The masking device of claim 34, wherein said first masking structure, when disposed in a closed position, acts as a shutter to protect said second masking structure from said beam.

57. The masking device of claim 34, wherein said first masking structure and said second masking structure are modular units.

58. The masking device of claim 34, wherein said first masking structure, or said second masking structure, or both said first and second masking structures, is provided with an electrostatic discharge device.

59. The masking device of claim 58, wherein said electrostatic discharge device comprises a rod mounted on a blade of said first masking structure, said second masking structure or both said first and second, masking structures, so as to direct an electrostatic charge away from particular components of the apparatus, 60. The masking device of claim 34, comprising a control mechanism configured to control a pair of blades of said first or second masking structures to prevent collision between each blade.

61. The masking device of claim 34, wherein the second direction defines a scanning direction in a Y-direction, and the first direction defines a non-scanning direction in a X-direction, said X-direction being substantially perpendicular to said Y-direction.

62. The masking device of claim 34, wherein the distance between the first masking structure and the second masking structure is less than 200 micrometers.

63. The masking device of claim 34, wherein the first and second masking structures are positioned within a small distance of the focal plane to allow a sufficiently sharp slit to be projected onto the patterning device.

* * * * *

UNITED STATES PATENT AND TRADEMARK OFFICE
CERTIFICATE OF CORRECTION

PATENT NO. : 8,059,261 B2  
APPLICATION NO. : 10/855976  
DATED : November 15, 2011  
INVENTOR(S) : Antoine Hendrik Verweij et al.

Page 1 of 1

It is certified that error appears in the above-identified patent and that said Letters Patent is hereby corrected as shown below:

On title page, Item (75) Inventors, Line 4
 replace "Gernert"
 with --Gemert--.

Signed and Sealed this
Twenty-first Day of February, 2012

David J. Kappos
*Director of the United States Patent and Trademark Office*